(12) United States Patent
Ohtake et al.

(10) Patent No.: US 10,381,238 B2
(45) Date of Patent: Aug. 13, 2019

(54) PROCESS FOR PERFORMING SELF-LIMITED ETCHING OF ORGANIC MATERIALS

(71) Applicant: Tokyo Electron Limited, Minato-ku, Tokyo (JP)

(72) Inventors: Hiroto Ohtake, Beaverton, OR (US); Takahito Mukawa, Beaverton, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/909,697

(22) Filed: Mar. 1, 2018

(65) Prior Publication Data
US 2018/0254191 A1    Sep. 6, 2018

Related U.S. Application Data

(60) Provisional application No. 62/467,025, filed on Mar. 3, 2017.

(51) Int. Cl.
*H01L 21/311* (2006.01)
*H01L 21/67* (2006.01)
*H01J 37/32* (2006.01)

(52) U.S. Cl.
CPC ...... *H01L 21/31138* (2013.01); *H01J 37/321* (2013.01); *H01J 37/32091* (2013.01); *H01J 37/32449* (2013.01); *H01L 21/67069* (2013.01); *H01J 2237/3341* (2013.01)

(58) Field of Classification Search
USPC .......................................................... 438/725
See application file for complete search history.

(56) References Cited

U.S. PATENT DOCUMENTS 6,074,569 A  *  6/2000  Kiziloglu ............... G03F 7/427
                                                                    216/62

* cited by examiner

*Primary Examiner* — Roberts P Culbert
(74) *Attorney, Agent, or Firm* — Rothwell, Figg, Ernst & Manbeck, P.C.

(57) ABSTRACT

A method and apparatus for selectively etching an organic material on a substrate is described. The method and apparatus includes forming a first plasma-excited process gas containing hydrogen (H) and optionally a noble gas element, exposing the substrate to the first plasma-excited process gas, forming a second plasma-excited process gas containing a noble gas element, exposing the substrate to the second plasma-excited process gas, and cyclically repeating the forming and exposing the first and second plasma-excited process gases at least two cycles to etch the first material selectively relative to the second material.

19 Claims, 5 Drawing Sheets

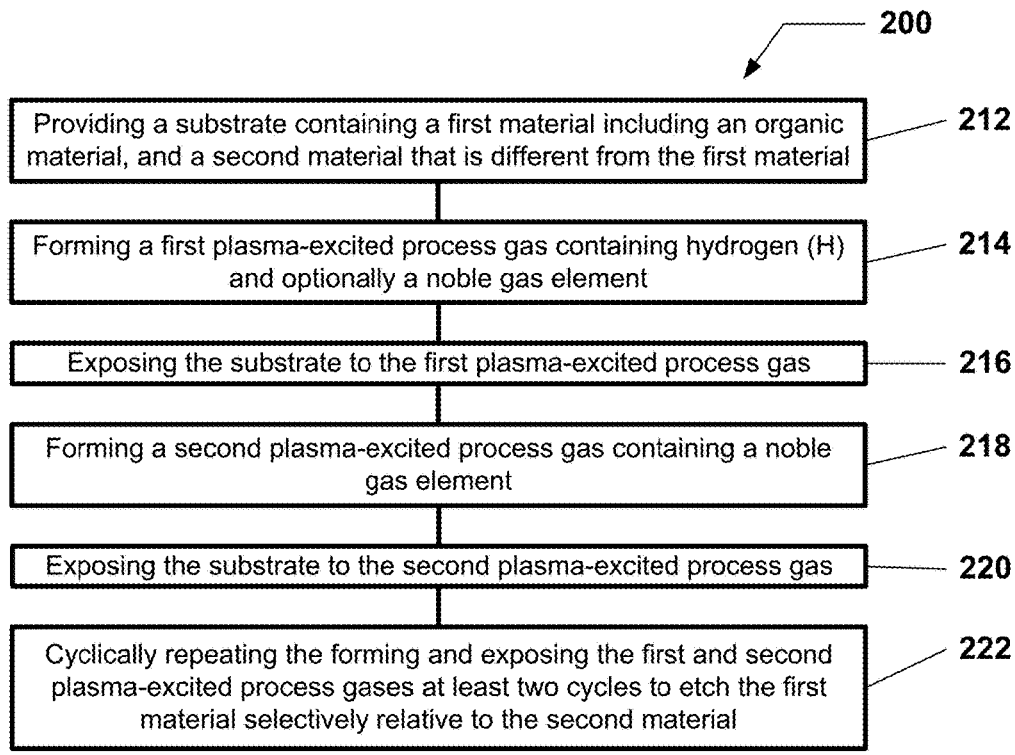
FIG. 2
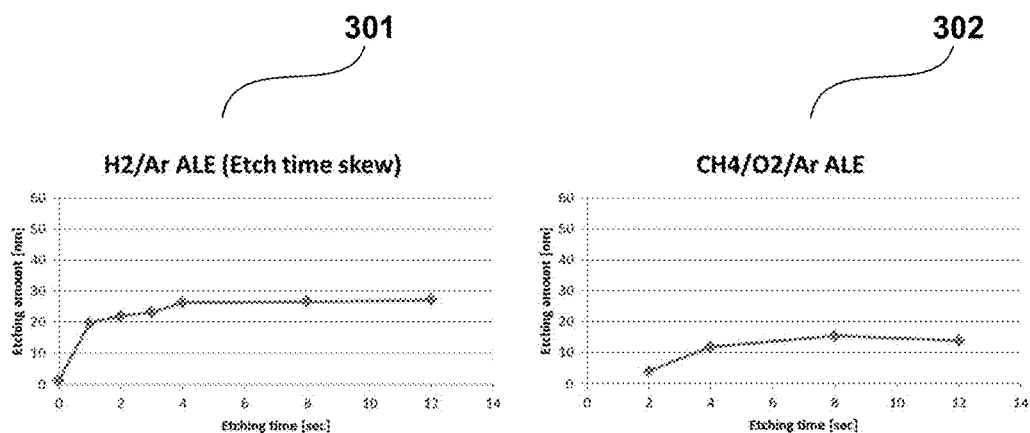
FIG. 3A
FIG. 3B

PROCESS FOR PERFORMING SELF-LIMITED ETCHING OF ORGANIC MATERIALS

CROSS REFERENCE TO RELATED APPLICATIONS

The present application claims the benefit of U.S. Provisional Patent Application No. 62/467,025, filed on Mar. 3, 2017, entitled "PROCESS FOR PERFORMING SELF-LIMITED ETCHING OF ORGANIC MATERIALS" which is incorporated herein by reference in its entirety.

FIELD OF INVENTION

The invention relates to a method for selectively etching one material on a substrate relative to another material on the substrate using plasma.

DESCRIPTION OF RELATED ART

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Plasma etching is a standard technique used to manufacture semiconductor integrated circuitry by transferring geometric shapes and patterns from a lithographic mask to underlying layers of a semiconductor wafer. With increasing aspect ratios and more complex materials, the need for state-of-the-art etching processes that meet selectivity and profile control requirement is becoming increasingly critical.

SUMMARY OF THE INVENTION

Embodiments of the invention relate to a method for selectively etching one material on a substrate relative to another material on the substrate using plasma.

According to one embodiment, a method of etching is described. The method includes providing a substrate containing a first material including an organic material, and a second material that is different from the first material. The method further includes forming a first plasma-excited process gas containing hydrogen (H) and optionally a noble gas element, exposing the substrate to the first plasma-excited process gas, forming a second plasma-excited process gas containing a noble gas element, exposing the substrate to the second plasma-excited process gas, and cyclically repeating the forming and exposing the first and second plasma-excited process gases at least two cycles to etch the first material selectively relative to the second material.

According to another embodiment, an apparatus for etching is described. The apparatus includes a gas introducing element, a plasma generating element, and a substrate holding element for holding a substrate. The apparatus further includes a logic element for programmably controlling an etching process, wherein the etching process proceeds according to instructions from the logic element that include: receiving the substrate containing a first material including an organic material, and a second material that is different from the first material; forming a first plasma-excited process gas containing hydrogen (H) and optionally a noble gas element; exposing the substrate to the first plasma-excited process gas; forming a second plasma-excited process gas containing a noble gas element; exposing the substrate to the second plasma-excited process gas; and cyclically repeating the forming and exposing the first and second plasma-excited process gases at least two cycles to etch the first material selectively relative to the second material.

BRIEF DESCRIPTION OF THE DRAWINGS

In the accompanying drawings:

FIG. 2 provides a flow chart illustrating a method of etching a substrate according to an embodiment;

FIGS. 3A and 3B provide data illustrating the time required to self-limit adsorption using different chemistry according to embodiments;

DETAILED DESCRIPTION OF SEVERAL EMBODIMENTS

Figure 1A:
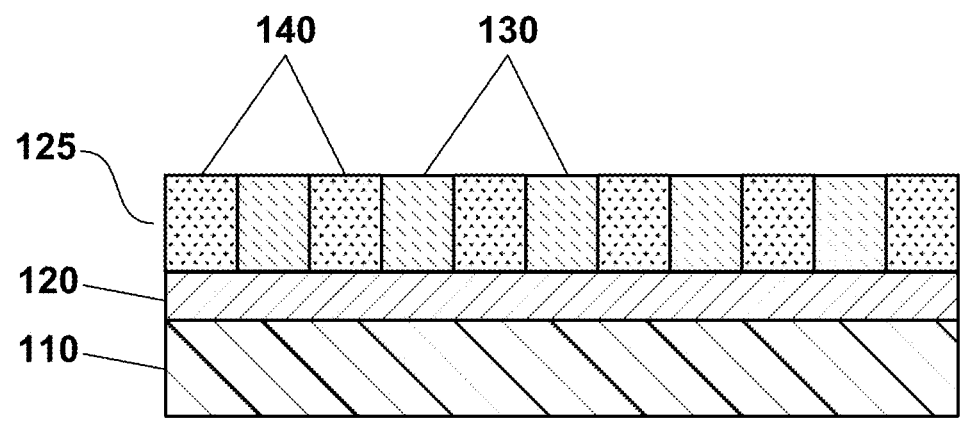
FIGS. 1A and 1B illustrate a schematic representation of a patterning sequence on a substrate.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

During pattern etching, a dry plasma etching process can be utilized, wherein plasma is formed from a process gas by coupling electro-magnetic (EM) energy, such as radio frequency (RF) power, to the process gas in order to heat electrons and cause subsequent ionization and dissociation of the atomic and/or molecular constituents of the process gas. Furthermore, the coupling of electromagnetic energy can be used to control the energy level of charged species incident on the exposed substrate surface. Through control of various plasma properties, including charged specie density, charged specie flux, charged specie energy, chemical flux, etc., a desired end result for the plasma etching process can be achieved according to embodiments described herein. In particular, embodiments are provided that achieve target etch selectivity, profile control, and substrate charging control.

As described above, materials, typically employed in semiconductor device manufacturing, are selectively removed relative to one another using plasma etching or plasma-assisted etching. Referring now to the drawings, wherein like reference numerals designate identical or corresponding parts throughout the several views, FIGS. 1A, 1B, 2, and 3 illustrate a method for etching a material on a microelectronic workpiece according to an embodiment. The method is pictorially illustrated in FIGS. 1A and 1B, and presented by way of a flow chart 200 in FIG. 2. As presented in FIG. 2, the flow chart 200 begins in 212 with providing a substrate 110 having a surface exposing a first material (130) and a second material (140) in a processing space of a plasma processing system. The second material is different than the first material.

As shown in FIG. 1A, the substrate 110 can include a patterned layer or multi-color layer 125 overlying a film stack, including one or more layers 120 to be etched or patterned. The patterned layer can include the first material 130 and the second material 140, and after etching, define an open feature pattern 150 in the remaining patterned layer 125 overlying the one or more layers 120. The substrate 110 further includes device layers. The device layers can include any thin film or structure on the substrate into which a pattern is to be transferred, or a target material is to be removed.

Layers 130 and 140 can be any material utilized in the manufacture of electronic devices, including semiconductor devices, electro-mechanical devices, photovoltaic devices, etc. However, to selectively etch one layer (e.g., layer 130 of a first material) relative to another layer (e.g., layer 140 of a second material), the material composition of the two layers is inherently different, such that each layer exhibits a different etch resistance when exposed to an etchant. Layer 130 can be an organic layer. In one embodiment, layer 130 can be essentially an organic material. In yet another embodiment, layer 130 consists of an organic material. Examples can include photo-sensitive resist, anti-reflective coatings, organic planarization layers, etc.

Layer 140 can be organic or inorganic materials. Layer 140 can be a silicon-containing material, germanium-containing material, carbon-containing material, or metal-containing material. For example, the second material can include silicon and mixtures with elements selected from the group consisting of O, C, N, and Ge. For example, silicon-containing materials can include amorphous silicon (a-Si), polycrystalline silicon (poly-Si), single crystal silicon, doped silicon, silicon oxide (SiOx), silicon nitride (SiNy), silicon carbide (SiCz), silicon oxynitride (SiOxNy), silicon oxycarbide (SiOxCz), silicon-germanium alloy (SixGe1-x), etc. Metal-containing materials can include a metal, a metal alloy, a transition metal (e.g., Ti, Ta, W, Ru, Co, Ni, Hf, etc.), transition metal oxide (e.g., titanium oxide (TiOx)), transition metal nitride (e.g., titanium nitride (TiNy)), carbides, chalcogenides, etc. Examples can include silicon-containing resists, anti-reflective coatings, or planarization layers with varying degrees of silicon content. The above materials, including the first and the second material, may be deposited using vapor deposition techniques, or spin-on deposition techniques.

Figure 1B:
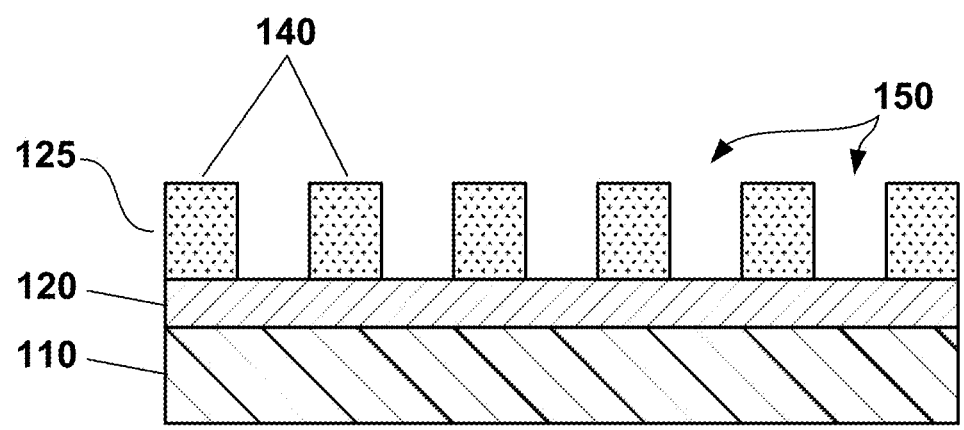

In FIG. 1B and in steps 214, 216, 218, 220 of FIG. 2, the open feature pattern 150 is formed in the patterned layer 125 by selectively removing the first material 130. As a result, the open feature pattern 150 overlies the underlying one or more layers 120, and subsequent to formation, can be extended into the underlying one or more layers 120. The removal of the first material 130 is achieved by performing a modulated plasma etching process to selectively remove the first material (130) at a rate greater than removing the second material (140). A logic element is configured and arranged for programmably controlling the etching process, wherein the etching process proceeds according to instructions from the logic element that include the following.

In 214, a first plasma-excited process gas containing hydrogen (H) and optionally a noble gas element is formed, and in 216, the substrate is exposed to the first plasma-excited process gas. In one embodiment, the first plasma-excited process gas contains $H_2$ and optionally a noble gas element (e.g., Ar). In another embodiment, the first plasma-excited process gas contains $H_2$ and Ar. In another embodiment, the first plasma-excited process gas contains a hydrocarbon gas, having the chemical formula $C_xH_y$, where x and y are real numbers greater than zero, and optionally Ar. In another embodiment, the first plasma-excited process gas contains $CH_4$ and Ar. In yet another embodiment, the first plasma-excited process gas further includes $O_2$. The first plasma-excited process gas can be formed by introducing gas using a gas introducing element, to be described below.

In 218, a second plasma-excited process gas containing a noble gas element is formed, and in 220, the substrate is exposed to the second plasma-excited process gas. In one embodiment, the second plasma-excited process gas contains a noble gas element, such as He, Ne, Kr, Xe, and Ar. The second plasma-excited process gas can be formed by introducing gas using a gas introducing element, to be described below.

In 222, the forming and exposing the first and second plasma-excited process gases are cyclically repeated at least two cycles to etch the first material selectively relative to the second material. During the modulated etch process, a first power coupling signal can be applied during the exposing the first plasma-excited process gas, and a second power coupling signal can be applied during the exposing the second plasma-excited process gas. The application of the first power coupling signal can include coupling radio frequency (RF) power to a plasma generating element, or a substrate holding element, or both a plasma generating element and a substrate holding element. The application of the second power coupling signal can include coupling radio frequency (RF) power to a plasma generating element, or a substrate holding element, or both a plasma generating element and a substrate holding element. The first power coupling signal can differ from the second power coupling signal by at least one of frequency, amplitude, phase, waveform shape, or duty cycle.

As noted above, in one embodiment, the first plasma-excited process gas contains $H_2$ and Ar, and the second plasma-excited process gas contains Ar. FIG. 3A is a plot 301 illustrating the etch amount per cycle when performing the forming and exposing the first and second plasma-excited process gases as a function of the time duration for performing the forming and exposing the first plasma-excited process gas. At a time duration of about 2-4 seconds, the etch amount 'saturates', or only marginally increases with increasing time duration. The flow rate of Ar can exceed the flow rate of $H_2$. During the performing the forming and exposing the first plasma-excited process gas, the RF power coupled to the substrate holding element can be set to substantially zero or low-level. During the performing the forming and exposing the second plasma-excited process gas, the RF power coupled to the substrate holding element can be set to a non-zero value.

As noted above, in another embodiment, the first plasma-excited process gas contains $CH_4$, Ar, and $O_2$, and the second plasma-excited process gas contains Ar. FIG. 3B illustrates the etch amount per cycle when performing the forming and exposing the first and second plasma-excited process gases as a function of the time duration for performing the forming and exposing the first plasma-excited process gas. At a time duration of about 4-5 seconds, the etch amount 'saturates', or only marginally increases with increasing time duration. The flow rate of Ar can exceed the flor rate of $CH_4$, and the flow rate of $CH_4$ can exceed the flow rate of $O_2$. During the performing the forming and exposing the first plasma-excited process gas, the RF power coupled to the substrate holding element can be set to substantially zero or low-level. During the performing the forming and exposing the second plasma-excited process gas, the RF power coupled to the substrate holding element can be set to a non-zero value.

The time duration for exposing the substrate to the first plasma-excited process gas can be set to be equal to or greater than the time necessary to substantially saturate the substrate with hydrogen. For example, the time duration for exposing the substrate to the first plasma-excited process gas is equal to or greater than 1 second, or the time duration for exposing the substrate to the first plasma-excited process gas ranges from 0.01 seconds to 5 seconds.

Figure 4:
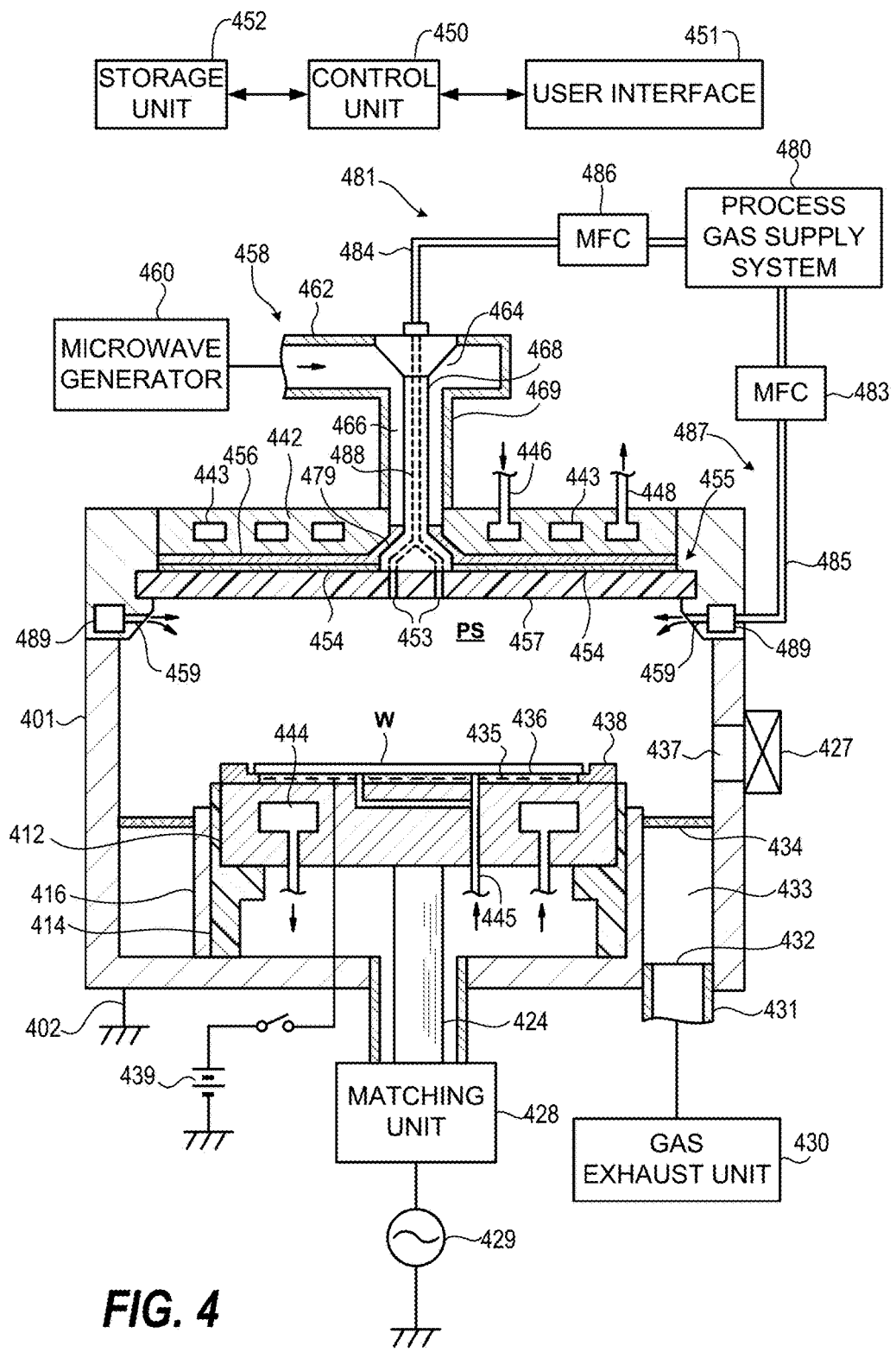
FIG. 4 shows a schematic representation of a plasma processing system according to an embodiment.
Figure 5:
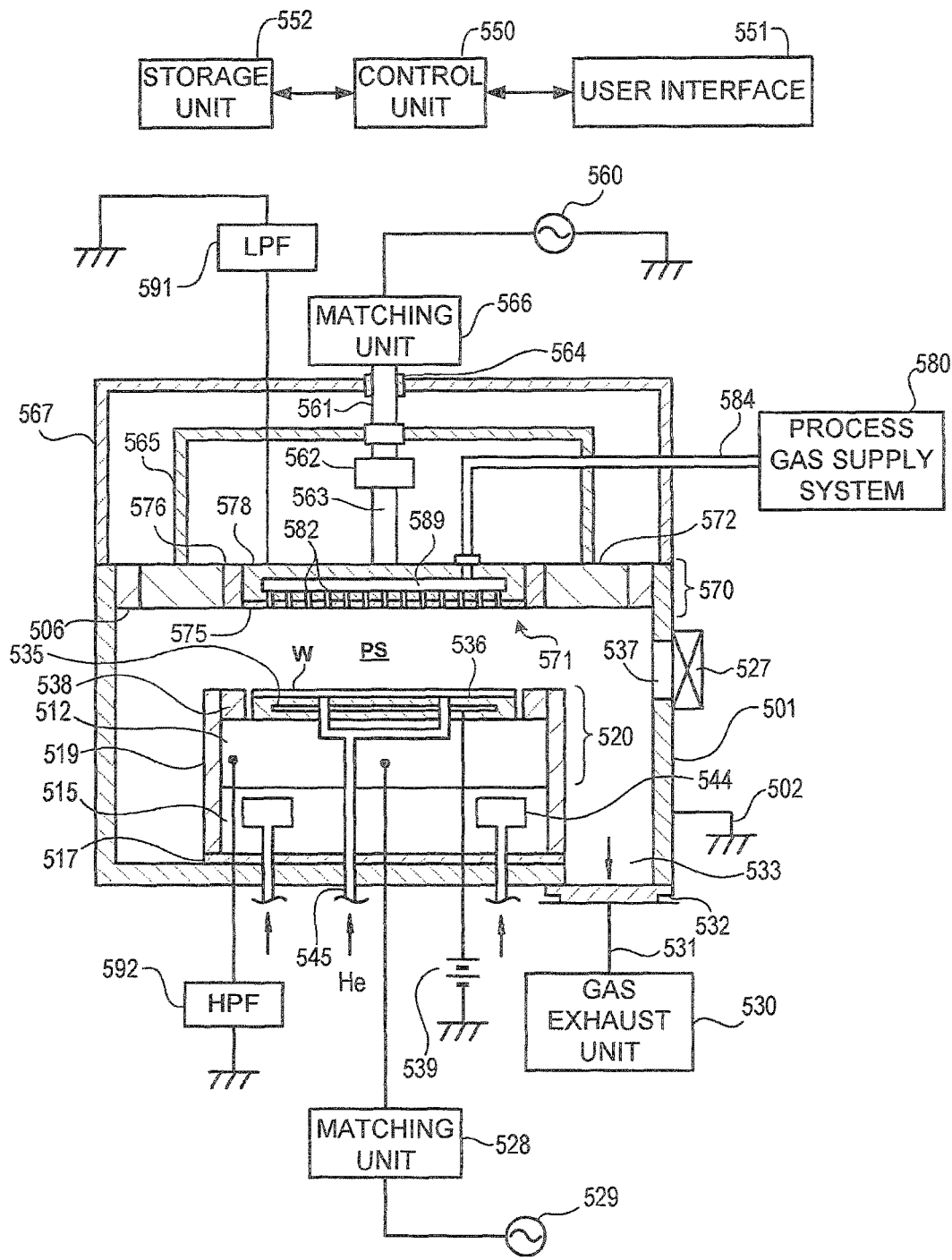
FIG. 5 shows a schematic representation of a plasma processing system according to another embodiment.
Figure 6:
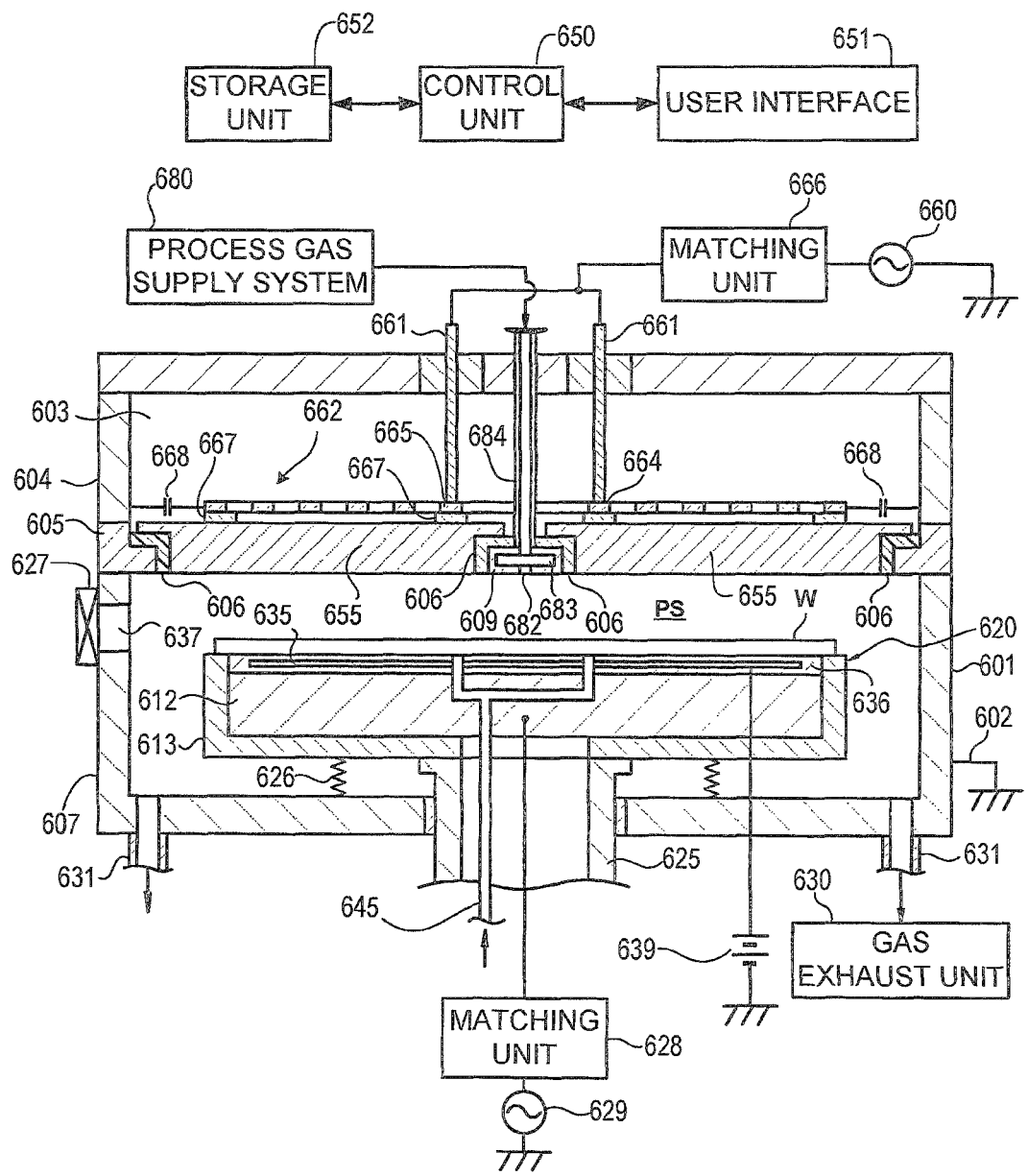
FIG. 6 shows a schematic representation of a plasma processing system according to yet another embodiment.

As described above, the modulated plasma etching process can include modulation of the radio frequency (RF) power delivered to a substrate holding element, substrate holder or susceptor upon which the substrate is positioned. The substrate holding element can position the substrate facing a plasma generating element, an RF powered electrode, such as a capacitive coupling element, or inductive coupling element (to be described below). Alternatively, the substrate holding element can position the substrate facing a slotted plane antenna, wherein power at a microwave frequency is coupled to the slotted plane antenna, for example. Exemplary systems are depicted in FIGS. 4 through 6. While the modulation of the RF power delivered to the substrate holding element is described, it can alternatively be coupled to other power coupling elements in the plasma processing system.

During the modulated plasma etching process, at least one property of the modulation cycle may be adjusted. The at least one property may include a power amplitude, a modulation frequency, a modulation duty cycle, a modulation waveform, or a modulation phase (relative to other modulated properties, such as gas flow, source and/or bias power, etc.).

In one embodiment, the modulated plasma etching process may comprise a process parameter space that includes: a chamber pressure ranging up to about 1000 mtorr (millitorr) (e.g., up to about 200 mtorr, or up to about 50 to 150 mtorr), a process gas flow rate ranging up to about 2000 sccm (standard cubic centimeters per minute) (e.g., up to about 1000 sccm, or about 1 sccm to about 200 sccm), an optional noble gas (e.g., He or Ar) flow rate ranging up to about 2000 sccm (e.g., up to about 1000 sccm), an upper electrode/antenna power ranging up to about 2000-to-5000 W (watts) (e.g., up to about 1000 W, or up to about 600 W), and a lower electrode power ranging up to about 1000-to-2000 W (e.g., up to about 600 W, or up to about 100 W, or up to 50 W). Also, the upper electrode/antenna frequency can range from about 0.1 MHz to about 3 GHz. In addition, the lower electrode RF frequency can range from about 0.1 MHz to about 100 MHz, e.g., about 2 MHz or 13 MHz.

One or more of the methods for etching a substrate described above may be performed utilizing a plasma processing system, such as the one the systems described in FIGS. 4 through 6. However, the methods discussed are not to be limited in scope by this exemplary presentation. The method of etching a substrate according to various embodiments described above may be performed in other plasma processing systems not specifically described below. Furthermore, various componentry described in FIGS. 4 through 6 can be utilized, replaced with, or complemented by other componentry not described. While one or more RF or microwave power sources of various electromagnetic frequency is described, multiple sources above, below, or surrounding the substrate W is contemplated.

FIG. 4 is a schematic cross-sectional view of a microwave plasma processing apparatus in accordance with embodiments herein. The microwave plasma processing apparatus can be configured to perform plasma processing, such as plasma etching, plasma enhanced chemical vapor deposition (PECVD), plasma enhanced atomic layer deposition (PEALD), etc., via surface wave plasma excitation at microwave frequencies using, for example, a flat, plate-type slot antenna. Plasma processing can be executed within processing chamber 401, which can be a cylindrical vacuum chamber composed of a machined or cast metal, such as aluminum or stainless steel. The processing chamber 401 is electrically grounded using, for example, ground wire 402. The processing chamber 401 defines a processing vessel providing a process space PS for plasma generation. An inner wall of the processing vessel can be coated with a protective barrier, such as alumina, yttria, or other protectant.

At a lower, central area within the processing chamber 401, a susceptor 412 (which can be disc-shaped) can serve as a mounting table on which, for example, a substrate W to be processed (such as a semiconductor wafer) can be mounted. Substrate W can be moved into the processing chamber 401 through loading/unloading port 437 and gate valve 427. An electrostatic chuck 436 is provided on a top surface of the susceptor 412. Clamp electrode 435 is electrically connected to DC (direct current) power source 439. The electrostatic chuck 436 attracts the substrate W thereto via an electrostatic force generated when a DC voltage from the DC power source 439 is applied to the clamp electrode 435 so that substrate W is securely mounted on the susceptor 412.

A high-frequency power source 429 for applying a RF (radio frequency) bias is electrically connected to the susceptor 412, or bias electrode through an impedance matching unit 428 (to match impedance or minimize reflected power) and a power feeding rod 424. The high-frequency power source 429 can output a high-frequency voltage in a range from, for example, 0.2 MHz to 20 MHz, e.g., 13.56 MHz. Applying a high frequency bias power attracts ions, generated by the plasma in the processing chamber 401, to substrate W. Power source 429 can include a signal generator and amplifier for modulating the amplitude and power output from the power source 429 according to the modulation cycle described above. A focus ring 438 is provided radially outside the electrostatic chuck 436 to surround the substrate W.

A coolant flow path 444 can extend, for example, in a circumferential direction, within susceptor 412 and can be configured to receive circulated coolant to assist with controlling a processing temperature of substrate W on the electrostatic chuck 436. Additionally, a heat transfer gas from a heat transfer gas supply unit (not illustrated) can be supplied to a space between a top surface of the electrostatic chuck 436 and a rear surface of the substrate W through a gas supply line 445.

An exhaust path 433 can be formed along an outer periphery of support unit 414 and/or conductive support unit 416 and an inner wall of the processing chamber 401 in which an annular baffle plate 434 is attached to the top or inlet of the exhaust path 433 and an exhaust port 432 (or multiple exhaust ports), which is provided in a bottom portion of the exhaust path 433. A gas exhaust unit 430 is connected to each exhaust port 432 through gas exhaust line 431, which can have multiple exhaust lines. The gas exhaust unit 430 can include a vacuum pump such as a turbo molecular pump configured to decompress the plasma processing space within the processing chamber 401 to a desired vacuum condition.

An upper portion of the microwave plasma processing apparatus will now be described. A dielectric window 457 is arranged to seal an upper portion of the processing chamber 401, through which electromagnetic radiation at microwave frequencies can propagate to the process space PS. A space just below the dielectric window 457 within the processing chamber 401 serves as a plasma generation space as process space PS. The dielectric window 457 can be made of a microwave-permeable dielectric material, such as quartz or ceramic, including aluminum oxide, and can have a thickness of, for example, about 20 mm (millimeters) or sufficient thickness to mechanically resist the pressure difference between an interior of the processing chamber 401 and the ambient environment. The dielectric window 457 can be provided with a slot plate 454 which can be a conductor attached to, or disposed on, a top surface of the dielectric window 457. The slot plate 454 can have a plurality of slot pairs that are configured to irradiate microwaves distributed concentrically in a rotationally symmetric arrangement, though other geometric configurations can be used. On the slot plate 454, a dielectric plate 456 can shorten the wavelength of microwaves propagated inside the slot plate 454. The slot plate 454 is electromagnetically coupled to a microwave transmission line 458. A slot antenna 455, which can be a flat plate-type slot antenna, for example, or a disc-shaped, radial line slot antenna, can include the slot plate 454, the dielectric plate 456, and an antenna rear plate (not shown) provided to be opposite to the slot plate 454.

The microwave transmission line 458 is a line configured to propagate or transmit electromagnetic waves at microwave frequencies or other frequencies, for example, microwaves of 2.45 GHz, which are output from a microwave generator 460 at a predetermined power level, to the slot antenna 455. The microwave transmission line 458 can include a waveguide 462, a waveguide-coaxial line converter 464, and a coaxial line 466. The waveguide 462 can be, for example, a rectangular waveguide configured to transmit microwaves from the microwave generator 460 to the waveguide-coaxial line converter 464. The coaxial line 466 extends from the waveguide-coaxial line converter 464 to the central portion of the top of the processing chamber 401 and a terminal end of the coaxial line 466 is coupled to the slot antenna 455 through the dielectric plate 456. An outer conductor 469 and an inner conductor 468 can define a space for wave transmission. A connector unit 479 is connected to the lower end of the inner conductor 468.

In addition, as electromagnetic waves propagate radially through the dielectric plate 456, the wavelength shortens, and the wave mode transitions to plane waves of circular polarization having two orthogonal polarization components from each slot pair of the slot antenna 455 that are radiated toward the inside of the processing chamber 401. Process gas in the vicinity of the surface of the dielectric window 457 is then ionized by the electric fields of surface waves (microwave electric fields) propagated in the radial direction along the surface of the dielectric window 457 and, as a result, high-density and low-electronic temperature plasma is generated.

The dielectric plate 456 can include a cooling jacket plate 442, which can serve as an antenna rear plate to cover a top of the processing chamber 401. The cooling jacket plate 442 can be configured to absorb heat (radiating) of dielectric loss, which is generated from the dielectric window 457 and the dielectric plate 456. To provide cooling, a coolant can be circulated in a flow path 443, and fed and removed through conduit 446 and conduit 448.

The microwave plasma processing apparatus can include two routes for process gas introduction. Upper gas introduction section 481 includes a gas flow path provided in the dielectric window 457, and a side gas introduction section 487 that includes a gas flow path provided in a side wall of the processing chamber 401, as a gas introduction mechanism configured to introduce a processing gas into the processing chamber 401.

In the upper gas introduction section 481, a gas flow path 488 is provided in the inner conductor 468 of the coaxial line 466 to extend in an axial direction through the inside of the inner conductor 468. Additionally, a first gas supply line 484 from a process gas supply system 480 is connected to the upper end of the inner conductor 468 and the gas flow path 488 of the first gas supply line 484. The connector unit 479 can have a plurality of internal flow paths which are bored and radially branched from a common inlet. The connector unit 479 can be made of a conductor, and can be electrically grounded. The dielectric window 457 can be formed with inner flow paths connected to the terminal ends of a branched gas supply paths such as for process gas to vertically pass through the dielectric window 457 to face the plasma generation space within the processing chamber 401.

In the upper gas introduction section 481, a processing gas, which is communicated from the process gas supply system 480 at a predetermined pressure (for example, an etching gas or a film-forming gas), flows through the first gas supply line 484, the gas flow path 488 of the coaxial line 466, and is ejected from each gas jet port 453 at the terminal end. A mass flow controller (MFC) 486 and corresponding valve can be used for opening/closing and metering process gas flow in first gas supply line 484.

The side gas introduction section 487 is placed at a position lower than a bottom surface of the dielectric window 457, and can include a buffer chamber 489 (manifold), sidewall gas jet ports 459, and a second gas supply line 485 extending from the process gas supply system 480 to the buffer chamber 489. A mass flow controller 483 and corresponding valve can be used for opening/closing and metering process gas flow in second gas supply line 485. Process gas from side gas introduction section 487 can be jetted in a substantially horizontal flow from the respective sidewall gas jet ports 459 to be diffused in the process space PS.

Components of the plasma processing apparatus can be connected to, and controlled by, a control unit 450 having logic elements, which in turn can be connected to a corresponding storage unit 452 and user interface 451. Control unit 450 can include a microcomputer configured to control operation of each of the components within the microwave plasma processing apparatus such as, for example, the gas exhaust unit 430, the high-frequency power source 429, DC power source 439 for the electrostatic chuck 436, microwave generator 460, the upper gas introduction section 481, the side gas introduction section 487, the process gas supply system 480, and a heat transfer gas supply unit (not illustrated) or the operations of the entire apparatus. Various plasma processing operations can be executed via the user interface 451, and various plasma processing recipes and operations can be stored in the storage unit 452. Accordingly, a given substrate can be processed within the plasma processing chamber with various microfabrication techniques.

FIG. 5 is a schematic cross-sectional view of a capacitively coupled plasma processing apparatus in accordance with embodiments herein. This apparatus can be used for multiple operations including ashing, etching, deposition, cleaning, plasma polymerization, plasma-enhanced chemical vapor deposition (PECVD), and so forth. Plasma processing can be executed within processing chamber 501, which can be a vacuum chamber composed of a metal, such as aluminum or stainless steel. The processing chamber 501 is grounded using, for example, a ground wire 502. The processing chamber 501 defines a processing vessel providing a process space PS for plasma generation. An inner wall of the processing vessel can be coated with alumina, yttria, or other protectant. The processing vessel can be cylindrical in shape, or have other geometric configurations.

At a lower, central area within the processing chamber 501, a susceptor 512 (which can be disc-shaped) can serve as a mounting table on which, for example, a substrate W to be processed (such as a semiconductor wafer) can be mounted. Substrate W can be moved into the processing chamber 501 through loading/unloading port 537 and gate valve 527. Susceptor 512 forms part of a lower electrode 520 (lower electrode assembly) as an example of a second electrode acting as a mounting table for mounting substrate W thereon. Specifically, the susceptor 512 is supported on a susceptor support 515, which is provided at substantially a central region of a bottom portion of processing chamber 501 via an insulating plate 517. The susceptor support 515 can be cylindrical. The susceptor 512 can be formed of an aluminum alloy, for example.

Susceptor 512 can be provided with an electrostatic chuck 536 (as part of the lower electrode assembly) for holding the substrate W. The electrostatic chuck 536 is provided with a clamp electrode 535. Clamp electrode 535 is electrically connected to DC (direct current) power source 539. The electrostatic chuck 536 attracts the substrate W thereto via an electrostatic force generated when a DC voltage from the DC power source 539 is applied to the clamp electrode 535 so that substrate W is securely mounted on the susceptor 512. A high-frequency power source 529 for applying a RF (radio frequency) bias is electrically connected to the susceptor 512, or bias electrode through an impedance matching unit 528 (to match impedance or minimize reflected power). The high-frequency power source 529 (a second power source) can output a high-frequency voltage in a range from, for example, 0.2 MHz to 20 MHz. Applying a high frequency bias power attracts ions, generated by the plasma in the processing chamber 501, to substrate W. Power source 529 can include a signal generator and amplifier for modulating the amplitude and power output from the power source 529 according to the modulation cycle described above. A focus ring 538 is provided radially outside the electrostatic chuck 536 to surround the substrate W.

An inner wall member 519, which can be cylindrical and formed of quartz, for example, can be attached to the outer peripheral side of the electrostatic chuck 536 and susceptor support 515. The susceptor support 515 includes a coolant flow path 544 (for flowing chilled or heated fluid). The coolant flow path 544 communicates with a chiller unit (not shown), installed outside the processing chamber 501. Coolant flow path 544 is supplied with coolant (cooling or heating liquid, such as water or dielectric fluid) circulating through corresponding lines. Accordingly, a temperature of the substrate W mounted on/above the susceptor 512 can be accurately controlled. A gas supply line 545, which passes through the susceptor 512 and the susceptor support 515, is configured to supply heat transfer gas to an upper surface of the electrostatic chuck 536. A heat transfer gas (also known as backside gas), such as helium (He), can be supplied between the substrate W and the electrostatic chuck 536 via the gas supply line 545 to assist in heating substrate W.

An exhaust path 533 can be formed along an outer periphery of inner wall member 519 and an inner sidewall surface of the processing chamber 501. An exhaust port 532 (or multiple exhaust ports) is provided in a bottom portion of the exhaust path 533. A gas exhaust unit 530 is connected to each exhaust port via gas exhaust line 531. The gas exhaust unit 530 can include a vacuum pump such as a turbo molecular pump configured to decompress the plasma processing space within the processing chamber 501 to a desired vacuum condition. The gas exhaust unit 530 evacuates the inside of the processing chamber 501 to thereby depressurize an inner pressure thereof up to a desired degree of vacuum.

An upper electrode 570 (that is, an upper electrode assembly), is an example of a first electrode that is positioned vertically above the lower electrode 520 to face the lower electrode 520 (as parallel plate electrodes, for example). The plasma generation space, or process space PS, is defined between the lower electrode 520 and the upper electrode 570. The upper electrode 570 can include an inner upper electrode 571 having a disk shape, for example, and an outer upper electrode 572 having an annular shape, for example, that surrounds a periphery of the inner upper electrode 571. The inner upper electrode 571 also functions as a processing gas inlet for injecting a specific amount of processing gas into the process space PS above substrate W mounted on the lower electrode 520. The upper electrode 570 thereby forms a shower head.

More specifically, the inner upper electrode 571 includes electrode plate 575 (which is typically circular) having gas injection openings 582. Inner upper electrode 571 also includes an electrode support 578 detachably supporting an upper side of the electrode plate 575. The electrode support 578 can be formed in the shape of a disk having substantially the same diameter as the electrode plate 575 (when electrode plate 575 is embodied as circular in shape). In alternative embodiments, electrode plate 575 can be square, rectangular, polygonal, etc. The electrode plate 575 can be formed of a conductor or semiconductor material, such as Si, SiC, doped Si, aluminum, and so forth. The electrode plate 575 can be integral with upper electrode 570, or detachably supported by electrode support 578 for convenience in replacing a given plate after surface erosion. The upper electrode 570 can also include a cooling plate or cooling mechanism (not shown) to control temperature of the electrode plate 575.

The electrode support 578 can be formed of, e.g., aluminum, and can include a buffer chamber 589. Buffer chamber 589 is used for diffusing process gas and can define a disk-shaped space. Processing gas from a process gas supply system 580 supplies gas to the upper electrode 570. The process gas supply system 580 can be configured to supply a processing gas for performing specific processes, such as film-forming, etching, and the like, on the substrate W. The process gas supply system 580 is connected with a gas supply line 584 forming a processing gas supply path. The gas supply line 584 is connected to the buffer chamber 589 of the inner upper electrode 571. The processing gas can then move from the buffer chamber 589 to the gas injection openings 582 at a lower surface thereof. A flow rate of processing gas introduced into the buffer chamber 589 can be adjusted using a mass flow controller, for example. Further, the processing gas introduced is uniformly discharged from the gas injection openings 582 of the electrode plate 575 (showerhead electrode) to the process space PS. The inner upper electrode 571 then functions in part to provide a showerhead electrode assembly.

A dielectric 576, having a ring shape, can be interposed between the inner upper electrode 571 and the outer upper electrode 572. An insulator 506, which can be a shield member having a ring shape and being formed of, e.g., alumina, is interposed between the outer upper electrode 572 and an inner peripheral wall of the processing chamber 501 in an air tight manner.

The outer upper electrode 572 is electrically connected with a high-frequency power source 560 (first high-frequency power source) via a power feeder 565, an upper power feed rod 561, and a matching unit 566. The high-frequency power source 560 can output a high-frequency voltage having a frequency of 40 MHz (megahertz) or higher (e.g., 60 MHz), or can output a very high frequency (VHF) voltage having a frequency of 3-300 MHz. This power source can be referred to as the main power supply as compared to a bias power supply. The power feeder 565 can be formed into a substantially cylindrical shape, for example, having an open lower surface. The power feeder 565 can be connected to the outer upper electrode 572 at the lower end portion thereof. The power feeder 565 is electrically connected with the lower end portion of the upper power feed rod 561 at the center portion of an upper surface thereof. The upper power feed rod 561 is connected to the output side of the matching unit 566 at the upper end portion thereof. The matching unit 566 is connected to the high-frequency power source 560 and can match load impedance with the internal impedance of the high-frequency power source 560. Note, however, that outer upper electrode 572 is optional and embodiments can function with a single upper electrode.

Power feeder 565 can be covered on an outside thereof by a ground conductor 567, which can be cylindrical having a sidewall whose diameter is substantially the same as that of the processing chamber 501. The ground conductor 567 is connected to the upper portion of a sidewall of the processing chamber 501 at the lower end portion thereof. The upper power feed rod 561 passes through a center portion of the upper surface of the ground conductor 567. An insulating member 564 is interposed at the contact portion between the ground conductor 567 and the upper power feed rod 561.

The electrode support 578 is electrically connected with a lower power feed rod 563 on the upper surface thereof. The lower power feed rod 563 is connected to the upper power feed rod 561 via a connector. The upper power feed rod 561 and the lower power feed rod 563 form a power feed rod for supplying high-frequency electric power from the high-frequency power source 560 to the upper electrode 570. A variable capacitor 562 is provided in the lower power feed rod 563. By adjusting the capacitance of the variable capacitor 562, when the high-frequency electric power is applied from the high-frequency power source 560, the relative ratio of an electric field strength formed directly under the outer upper electrode 572 to an electric field strength formed directly under the inner upper electrode 571 can be adjusted. The inner upper electrode 571 of the upper electrode 570 is electrically connected with a low pass filter (LPF) 591. The LPF 591 blocks or filters high frequencies from the high-frequency power source 560 while passing low frequencies from the high-frequency power source 529 to ground. A lower portion of the system, the susceptor 512, forming part of the lower electrode 520, is electrically connected with a high pass filter (HPF) 592. The HPF 592 passes high frequencies from the high-frequency power source 560 to ground.

Components of the plasma processing apparatus can be connected to, and controlled by, a control unit 550 having logic elements, which in turn can be connected to a corresponding storage unit 552 and user interface 551. Various plasma processing operations can be executed via the user interface 551, and various plasma processing recipes and operations can be stored in storage unit 552. Accordingly, a given substrate can be processed within the plasma processing chamber with various microfabrication techniques. In operation, the plasma processing apparatus uses the upper and lower electrodes to generate a plasma in the processing space PS. This generated plasma can then be used for processing a target substrate (such as substrate W or any material to be processed) in various types of treatments such as plasma etching, chemical vapor deposition, treatment of glass material and treatment of large panels such as thin-film solar cells, other photovoltaic cells, and organic/inorganic plates for flat panel displays, etc.

High-frequency electric power in a range from about 3 MHz to 300 MHz, is applied from the high-frequency power source 560 to the upper electrode 570. A high-frequency electric field is generated between the upper electrode 570 and the susceptor 512 or lower electrode. Processing gas delivered to process space PS can then be ionized and dissociated to form a reactive plasma. A low frequency electric power in a range from about 0.2 MHz to 20 MHz can be applied from the high-frequency power source 529 to the susceptor 512 forming the lower electrode. In other words, a dual or tri-frequency system can be used. As a result, ions in the plasma are attracted toward the susceptor 512 with sufficient energy to anisotropically etch features via ion assistance. Note that for convenience, FIG. 5 shows the high-frequency power source 560 supplying power to the upper electrode 570. In Alternative embodiments, the high-frequency power source 560 can be supplied to the lower electrode 520. Thus, both main power (energizing power) and the bias power (ion acceleration power) can be supplied to the lower electrode.

FIG. 6 is a schematic cross-sectional view of an inductively coupled plasma processing apparatus in accordance with embodiments herein. This apparatus can be used for multiple operations including ashing, etching, deposition, cleaning, plasma polymerization, plasma-enhanced chemical vapor deposition (PECVD), and so forth. Plasma processing can be executed within processing chamber 601, which can be a vacuum chamber composed of a metal, such as aluminum or stainless steel. The processing chamber 601 is grounded using, for example, a ground wire 602. The processing chamber 601 defines a processing vessel providing a process space PS for plasma generation. An inner wall of the processing vessel can be coated with alumina, yttria, or other protectant. The processing vessel can be cylindrical in shape, or have other geometric configurations.

At a lower, central area within the processing chamber 601, a susceptor 612 (which can be disc-shaped) can serve as a mounting table on which, for example, a substrate W to be processed (such as a semiconductor wafer) can be mounted. Substrate W can be moved into the processing chamber 601 through loading/unloading port 637 and gate valve 627. Susceptor 612 forms part of a lower electrode 620 (lower electrode assembly) as an example of a second electrode acting as a mounting table for mounting substrate W thereon. Specifically, the susceptor 612 is supported on a susceptor support 625, which is provided at substantially a central region of a bottom portion of processing chamber 601. The susceptor support 625 can be cylindrical. The susceptor 212 can be formed of an aluminum alloy, for example.

Susceptor 612 can be provided with an electrostatic chuck 636 (as part of the lower electrode assembly) for holding the substrate W. The electrostatic chuck 636 is provided with a clamp electrode 635. Clamp electrode 635 is electrically connected to DC (direct current) power source 639. The electrostatic chuck 636 attracts the substrate W thereto via an electrostatic force generated when a DC voltage from the DC power source 639 is applied to the clamp electrode 635 so that substrate W is securely mounted on the susceptor 612.

The susceptor 612 can include an insulating frame 613 and be supported by susceptor support 625, which can include an elevation mechanism. The susceptor 612 can be vertically moved by the elevation mechanism during loading and/or unloading of the substrate W. A bellows 626 can be disposed between the insulating frame 613 and a bottom portion of the processing chamber 601 to surround support 625 as an airtight enclosure. Susceptor 612 can include a temperature sensor and a temperature control mechanism, including a coolant flow path (for flowing chilled or heated fluid), a heating unit such as a ceramic heater or the like (all not shown) that can be used to control a temperature of the substrate W. The coolant flow path communicates with a chiller unit (not shown), installed outside the processing chamber 601. Coolant flow path is supplied with coolant (cooling or heating liquid, such as water or dielectric fluid) circulating through corresponding lines. A focus ring (not shown), can be provided on an upper surface of the susceptor 612 to surround the electrostatic chuck 636 and assist with directional ion bombardment.

A gas supply line 645, which passes through the susceptor 612, is configured to supply heat transfer gas to an upper surface of the electrostatic chuck 636. A heat transfer gas (also known as backside gas), such as helium (He) can be supplied between the substrate W and the electrostatic chuck 136 via the gas supply line 145 to assist in heating substrate W.

A gas exhaust unit 630, including a vacuum pump and the like, can be connected to a bottom portion of the processing chamber 601 through gas exhaust line 631. The gas exhaust unit 630 can include a vacuum pump, such as a turbo molecular pump, configured to decompress the plasma processing space within the processing chamber 601 to a desired vacuum condition during a given plasma processing operation.

The plasma processing apparatus can be partitioned into an antenna chamber 603 and a processing chamber 601 by a window 655. Window 655 can be a dielectric material, such as quartz, or a conductive material, such as metal. For embodiments in which the window 655 is metal, the window 655 can be electrically insulated from processing chamber 601, e.g., insulators 106. In this example, the window 655 forms a ceiling of the processing chamber 601. In some embodiments, window 655 can be divided into multiple sections, with these sections optionally insulated from each other.

Provided between sidewall 604 of the antenna chamber 603 and sidewall 607 of the processing chamber 601 is a support shelf 605 projecting toward the inside of the processing apparatus. A support member 609 serves to support window 655 and also functions as a shower housing for supplying a processing gas. When the support member 609 serves as the shower housing, a gas channel 683, extending in a direction parallel to a working surface of a substrate W to be processed, is formed inside the support member 609 and communicates with gas injection openings 682 for injecting process gas into the process space PS. A gas supply line 684 is configured to be in communication with the gas channel 683. The gas supply line 684 defines a flow path through the ceiling of the processing chamber 601, and is connected to a process gas supply system 680 including a processing gas supply source, a valve system and the corresponding components. Accordingly, during plasma processing, a given process gas can be injected into the process space PS.

In antenna chamber 603, a high-frequency antenna 662 (radio frequency) is disposed above the window 655 so as to face the window 655, and can be spaced apart from the window 655 by a spacers 667 made of an insulating material. High-frequency antenna 662 can be formed in a spiral shape or formed in other configurations.

During plasma processing, a high frequency power having a frequency ranging from a few MHz to hundreds of MHz, e.g., 13.56 MHz, to generate an inductive electric field can be supplied from a high-frequency power source 660 to the high-frequency antenna 662 via power feed members 661. A matching unit 666 (impedance matching unit) can be connected to high-frequency power source 660. The high-frequency antenna 662 in this example can have corresponding power feed portion 664 and power feed portion 665 connected to the power feed members 661, as well as additional power feed portions depending on a particular antenna configuration. Power feed portions can be arranged at similar diametrical distances and angular spacing. Antenna lines can extend outwardly from power feed portion 664 and power feed portion 665 (or inwardly depending on antenna configuration) to an end portion of antenna lines. End portions of antenna lines can be connected to the capacitors 668, and the antenna lines are grounded via the capacitors 668. Capacitors 668 can include one or more variable capacitors.

With a given substrate mounted within processing chamber 601, one or more plasma processing operations can be executed. By applying high frequency power to the high-frequency antenna 662, an inductive electric field is generated in the processing chamber 601, and processing gas supplied from the gas injection openings 682 is excited to form plasma in the presence of electrons heated by the inductive electric field. The plasma can then be used to process a given substrate, such as performing processes for etching, ashing, depositing, etc.

A high-frequency power source 629 for applying a RF (radio frequency) bias is electrically connected to the susceptor 612, or bias electrode through an impedance matching unit 628 (to match impedance or minimize reflected power). The high-frequency power source 629 (a second power source) can output a high-frequency voltage in a range from, for example, 0.2 MHz to 20 MHz, e.g., 3.2 MHz. Applying a high frequency bias power attracts ions, generated by the plasma in the processing chamber 601, to substrate W. Power source 629 can include a signal generator and amplifier for modulating the amplitude and power output from the power source 629 according to the modulation cycle described above.

Components of the plasma processing apparatus can be connected to, and controlled by, a control unit 650 having logic elements, which in turn can be connected to a corresponding storage unit 652 and user interface 651. Various plasma processing operations can be executed via the user interface 651, and various plasma processing recipes and operations can be stored in storage unit 652. Accordingly, a given substrate can be processed within the plasma processing chamber with various microfabrication techniques.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching, comprising:
    providing a substrate containing a first material including an organic material, and a second material that is different from the first material;
    forming a first plasma-excited process gas containing hydrogen (H) and optionally a noble gas element;
    exposing the substrate to the first plasma-excited process gas;
    forming a second plasma-excited process gas containing a noble gas element;
    exposing the substrate to the second plasma-excited process gas; and
    cyclically repeating the forming and exposing the first and second plasma-excited process gases at least two cycles to etch the first material selectively relative to the second material.

2. The method of claim 1, wherein the first material is essentially an organic material.

3. The method of claim 1, wherein the first material consists of an organic material.

4. The method of claim 1, wherein the second material is a silicon-containing material.

5. The method of claim 1, wherein the second material is silicon or silicon mixed with elements selected from the group consisting of O, C, N, and Ge.

6. The method of claim 1, wherein the first plasma-excited process gas contains $H_2$ and optionally Ar.

7. The method of claim 1, wherein the first plasma-excited process gas contains $H_2$ and Ar.

8. The method of claim 1, wherein the first plasma-excited process gas contains a hydrocarbon gas, having the chemical formula $C_xH_y$, where x and y are real numbers greater than zero, and optionally Ar.

9. The method of claim 1, wherein the first plasma-excited process gas contains $CH_4$ and Ar.

10. The method of claim 9, wherein the first plasma-excited process gas further includes $O_2$.

11. The method of claim 1, wherein the second plasma-excited process gas contains Ar.

12. The method of claim 1, further comprising:
    applying a first power coupling signal during the exposing the first plasma-excited process gas.

13. The method of claim 12, wherein applying the first power coupling signal includes coupling radio frequency (RF) power to a plasma generating element, or a substrate holding element, or both a plasma generating element and a substrate holding element.

14. The method of claim 12, further comprising:
    applying a second power coupling signal during the exposing the second plasma-excited process gas.

15. The method of claim 14, wherein applying the second power coupling signal includes coupling radio frequency (RF) power to a plasma generating element, or a substrate holding element, or both a plasma generating element and a substrate holding element.

16. The method of claim 12, wherein the first power coupling signal differs from the second power coupling signal by at least one of frequency, amplitude, phase, waveform shape, or duty cycle.

17. The method of claim 1, wherein the time duration for exposing the substrate to the first plasma-excited process gas is equal to or greater than the time necessary to substantially saturate the substrate with hydrogen.

18. The method of claim 1, wherein the time duration for exposing the substrate to the first plasma-excited process gas is equal to or greater than 1 second.

19. The method of claim 1, wherein the time duration for exposing the substrate to the first plasma-excited process gas ranges from 0.01 seconds to 5 seconds.

* * * * *

UNITED STATES PATENT AND TRADEMARK OFFICE
CERTIFICATE OF CORRECTION

| | | |
|---|---|---|
| PATENT NO. | : 10,381,238 B2 | |
| APPLICATION NO. | : 15/909697 | |
| DATED | : August 13, 2019 | |
| INVENTOR(S) | : Hiroto Ohtake and Takahito Mukawa | |

It is certified that error appears in the above-identified patent and that said Letters Patent is hereby corrected as shown below:

In the Specification

Column 13, Line 38, "212" should read --612--.

Column 14, Line 8, "136" should read --636--; Line 8, "145" should read --645--; and Line 24, "106" should read --606--.

In the Claims

Claim number 16, Column 16, Line 44, "claim 12" should read --claim 14--.

Signed and Sealed this
Fourteenth Day of June, 2022

Katherine Kelly Vidal
*Director of the United States Patent and Trademark Office*